United States Patent
Curnalia et al.

(10) Patent No.: US 7,930,812 B2
(45) Date of Patent: Apr. 26, 2011

(54) TOOLLESS RACK MOUNTING RAIL INSTALLATION LATCH

(75) Inventors: Michael Allen Curnalia, Tucson, AZ (US); John Geoffrey Gundlach, Cary, NC (US); Daniel Paul Kelaher, Holly Springs, NC (US); Gregory Mark Bennett, Hillsborough, NC (US)

(73) Assignee: International Business Machines Corporation, Armonk, NY (US)

( * ) Notice: Subject to any disclaimer, the term of this patent is extended or adjusted under 35 U.S.C. 154(b) by 1077 days.

(21) Appl. No.: 11/683,551

(22) Filed: Mar. 8, 2007

(65) Prior Publication Data
US 2008/0217274 A1 Sep. 11, 2008

(51) Int. Cl.
*B23P 19/00* (2006.01)
*H05K 7/18* (2006.01)

(52) U.S. Cl. ........................................ 29/426.6; 211/183

(58) Field of Classification Search ................. 29/426.6, 29/401.1, 428, 453, 57; 211/183; 439/350; 312/319.1, 333
See application file for complete search history.

(56) References Cited

U.S. PATENT DOCUMENTS

| | | | |
|---|---|---|---|
| 5,580,138 A * | 12/1996 | Grabher | 312/319.1 |
| 6,622,873 B2 | 9/2003 | Hegrenes et al. | |
| 6,830,300 B2 | 12/2004 | Lauchner | |
| 6,891,727 B2 | 5/2005 | Dittus et al. | |
| 6,926,378 B2 * | 8/2005 | Greenwald et al. | 312/334.4 |
| 7,023,708 B2 | 4/2006 | Nguyen et al. | |
| 2005/0072745 A1 | 4/2005 | Schmidtk et al. | |
| 2006/0141844 A1 * | 6/2006 | Tufano, Jr. | 439/350 |

* cited by examiner

*Primary Examiner* — John C Hong
(74) *Attorney, Agent, or Firm* — William Konrad; Konrad Raynes and Victor LLP (57) ABSTRACT

A method and apparatus for providing toolless rack mounting rail installation using a pin having a latch. A retention device according to an embodiment of the present invention includes stepped features and a dual locking mechanism that are configured to engage standard apertures of rack systems. The locking mechanism is configured to extend beyond the surface of a pin when in a normal position, but may be depressed to allow the retention device to be easily inserted or removed without the use of tools.

20 Claims, 14 Drawing Sheets

TOOLLESS RACK MOUNTING RAIL INSTALLATION LATCH

FIELD OF THE INVENTION

This disclosure relates in general to equipment enclosures, and more particularly to a method and apparatus for providing toolless rack mounting rail installation using a pin having a latch.

BACKGROUND

Data centers include different types of electronic equipment such as servers and disk arrays that store all types of data. Data centers makeup the backside of the Internet, but they can also be implemented as part of a campus of one or companies for enabling them to perform their functionalities. Typically, equipment racks are utilized within data centers as a way of organizing and housing different types of electronic equipment therein. For example, an industry standard EIA (Electronics Industries Alliance) rack is often used to contain servers in a stacked arrangement that uses the available space more efficiently.

Some companies with high computing requirements may require dozens of racks, with each rack holding multiple servers or other components. A simple maintenance task, such as upgrading a part of a server, may have to be performed on each server and therefore may be performed hundreds of times. For example, when a system is being built, a great deal of time is spent configuring the rack structure and physically installing components into the rack.

Racks are typically constructed with perforated, hinged front doors, rigid sides and a removable rear panel. Industry standard 19" EIA electronics racks are designed typically to house a column of electronics packages that are 17-¾" in width with varying depths. The height of an electronics package can vary but is normally an integer multiple of an EIA unit called simply the "U." An EIA U is 1.75 inches. Electronic equipment generally has a height in multiples of "Us" e.g., 1 U (1.75"), 2 U (3.50"), 3 U (5.25"), etc.

Typically, electronic components may be secured within the rack using a pair of rack rails that are secured to the rack structure. These rails may fix the component in place or support sliding mechanisms that enable the component to be easily moved in and out of the rack. Corresponding rails are located on the side surfaces of the electronics component, thus allowing the component to be pulled in and out of the rack frame easily.

The rails are attached to the vertical support columns by, for example, fasteners, such as screws, bolts and/or nuts. For example, rack nuts are installed adjacent selected apertures in the column flanges, and bolts are passed through apertures in mounting flanges of the rack mount assemblies and threaded into the rack nuts. With this type of rail, tools are required to attach the screws, bolts and nuts.

More recently, mounting systems have been developed for allowing attachment of the slides to the rack structure, and of the chassis to the slides, without the necessity of tools or separate installation hardware. However, these toolless mounting systems, while more convenient than previous mounting systems, have so far proved unsatisfactory. In particular, toolless mounting methods that have been developed typically cannot accommodate multiple mounting methods. Also, these mounting methods do not allow for maximum width systems to fit into the rack because the feature that holds onto the EIA rail of the rack must wrap around the EIA rail, thus taking a portion of the volume inside of the rack allotted to the system. Accordingly, these types of mounting systems force the system designers to give up precious system volume in order to accommodate the toolless mounting features. On highly dense 1 u servers, this loss of volume can be meaningful.

Finally, most of these designs require the installer to reach into the rack in order to release the rails, which can be difficult when removing a single system from a fully loaded rack. This is due to the release mechanism being located inside the actual mounting point on the rack, the EIA rail. Racks can also have different size and shape mounting holes, which complicates any toolless latching method. Toolless latching methods have been developed by different companies that can accommodate multiple mounting hole dimensions. However, prior toolless mounting systems have proven to be too complicated. Consequently, prior toolless rail mounting systems cannot be released without reaching into the rack, cannot accommodate various rack mounting hole shapes and sizes, and cannot be utilized with maximum width systems.

It can be seen that there is a need for method and apparatus for providing toolless rack mounting rail installation using a pin having a latch to provide ease of release, accommodation of various rack mounting hole shapes and sizes and use with maximum width systems.

SUMMARY OF THE INVENTION

To overcome the limitations in the prior art described above, and to overcome other limitations that will become apparent upon reading and understanding the present specification, the present invention discloses a method and apparatus for providing toolless rack mounting rail installation using a pin having a latch.

An embodiment of the present invention provides retention device having stepped features and a dual locking mechanism that are configured to engage standard apertures of rack systems. The locking mechanism is configured to extend beyond the surface of a pin when in a normal position, but may be depressed to allow the retention device to be easily inserted or removed without the use of tools.

A retention device according to an embodiment of the present invention includes a pin housing having a first and second aperture disposed on a first side of the pin housing along a longitudinal axis, a first and second latch disposed within the pin housing, the first and second latches each having a first and second lock and a resilient member arranged in the pin housing to apply a force to the latches to urge first and second locks through the first and second aperture of the pin housing, respectively.

In another embodiment of the present invention, a retention device for mounting a rail in a rack mount system is provided. The retention device according to this embodiment of the present invention includes a pin housing having a first aperture disposed on a first side of the pin housing along a longitudinal axis, a first and second latch disposed within the pin housing, the first and second latches each having a lock and a resilient member arranged in the pin housing to apply a force to the latches to urge the locks of the first and second latches through the first aperture of the pin housing, respectively.

In another embodiment of the present invention, a method for providing toolless rack mounting rail installation is provided. The method includes aligning apertures of a rail with apertures of a rack support structure, pushing a retention device having depressible latches in a first position through aligned apertures of the rail and the rack support member, depressing the latches to a second position as the retention device is inserted into an aperture and expanding the latches to the first position to lock the retention device in place after the retention device is placed in a fully seated position and the edges of the apertures are cleared by the latches.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method and apparatus for providing toolless rack mounting rail installation using a pin having a latch. An embodiment of the present invention provides a retention device includes stepped features and a dual locking mechanism that are configured to engage standard apertures of rack systems. The locking mechanism is configured to extend beyond the surface of a pin when in a normal position, but may be depressed to allow the retention device to be easily inserted or removed without the use of tools.

Figure 1:
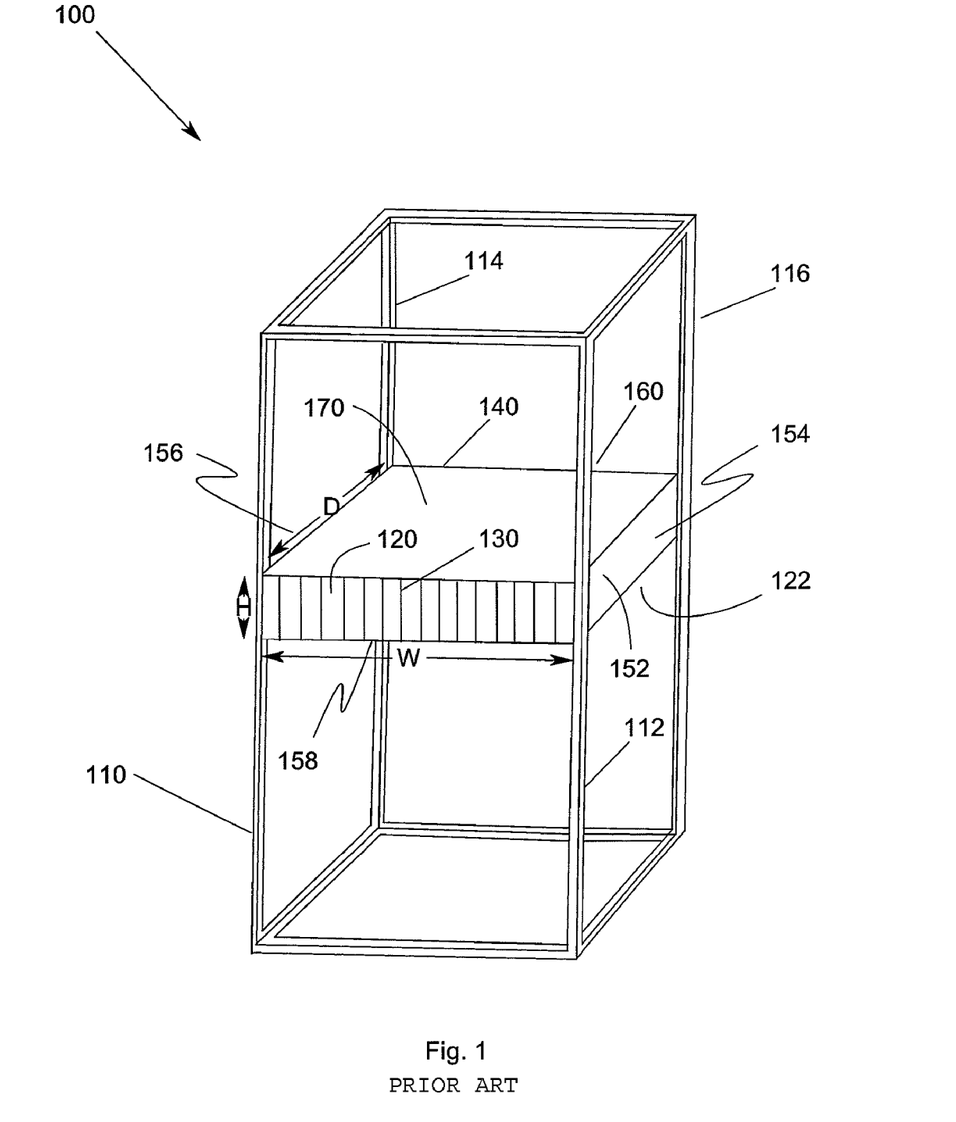
FIG. 1 illustrates a schematic perspective representation of a rack system.

FIG. 1 illustrates a schematic perspective representation of a rack system 100. In FIG. 1, rack system 100 includes left and right front uprights 110, 112 and left and right rear uprights 114, 116. The uprights can be formed with apertures for receiving shelf fixings (e.g., screws, bolts, clips, etc., for mounting brackets, slides, rails, etc.). Electronic devices 120, such as test equipment, sound system equipment, blade servers, etc., may be mounted in the rack system 100. For mounting such devices, a shelf 122 may be used to provide a carrier configured to carry a plurality of devices 120 located side by side along the shelf. The term "shelf" is used herein in a conventional way to describe a structure that is mountable in rack system 100 and is configured to carry one or more components to form at least a part of a rack-mountable system. In the present example, the shelf 122 is three-dimensional, having a height (H), width (W) and depth (D).

The devices 120, when aligned in the carrier shelf 122, look like rectangular blocks, or blades. Accordingly, the devices 120 can be described as a blade. In FIG. 1, the shelf 122 is configured to carry sixteen devices 120, each of which is removably mountable in a respective opening 130 in the front of the shelf, whereby the devices 120 can be inserted into and removed from the front of the shelf 122 without removing the shelf 122 from the rack system 100.

The shelf 122 includes a three-dimensional, generally rectangular, enclosure, or housing, 140 that is suitable for mounting in generic racking systems. It can be mounted on fixed rigid rack mounting ears and/or a simple slide/support rail system. The shelf enclosure 140 can be configured to form a chassis that includes a base 152, two sides 154, 156, a front 158 and a rear 160. The word "front" as used here is merely used as a label herein to refer to the face, or wall 158 of the enclosure that is located at the main access side of the rack system 100 in use when the shelf is mounted therein. Similarly, the words "rear" and "side" are merely used as labels herein to refer to the faces, or walls 154, 156, 160, that, in use, are located at those respective positions when the shelf is mounted in the rack system 100.

The openings 130 can be formed in the front face 158 for receiving the devices 120. The enclosure can further include a removable top cover 170 that can be secured by suitable fastening.

Figure 2:
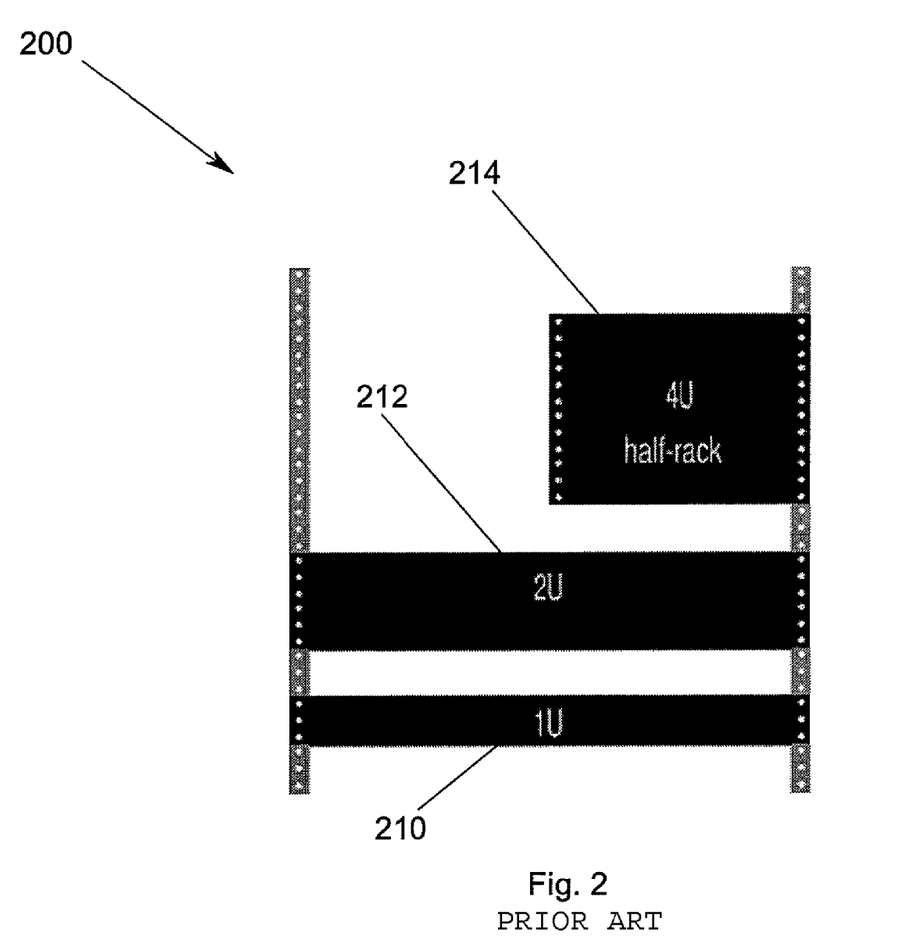
FIG. 2 is a front view of a rack system.

FIG. 2 is a front view of a rack system 200. In FIG. 2, three shelf units 210, 212, 214 are shown mounted in rack system 200. The size of the shelf units 210, 212, 214 are referred to in rack units, which is a unit of measure used to describe the height of the shelf units 210, 212, 214. One rack unit is commonly designated as "1 U"; similarly, 2 rack units are "2 U" and so on. The size of a piece of rack-mounted equipment is usually described as a number in "U".

Half-rack units typically describe units that fit in a certain number of rack units, but occupy only half the width of the rack (9.5 inches). For example, a "4 U half-rack" device would occupy 4 U space (4×1.75 inches) height×9.5 inches width. In theory, two half-rack devices could occupy the 4 U space.

Fixed or slide rails are fastened using either screws or, more preferably some toolless latching method to reduce the time required for installation. Additionally, racks can have different size and shape mounting holes, which complicates any toolless latching method.

Figure 3:
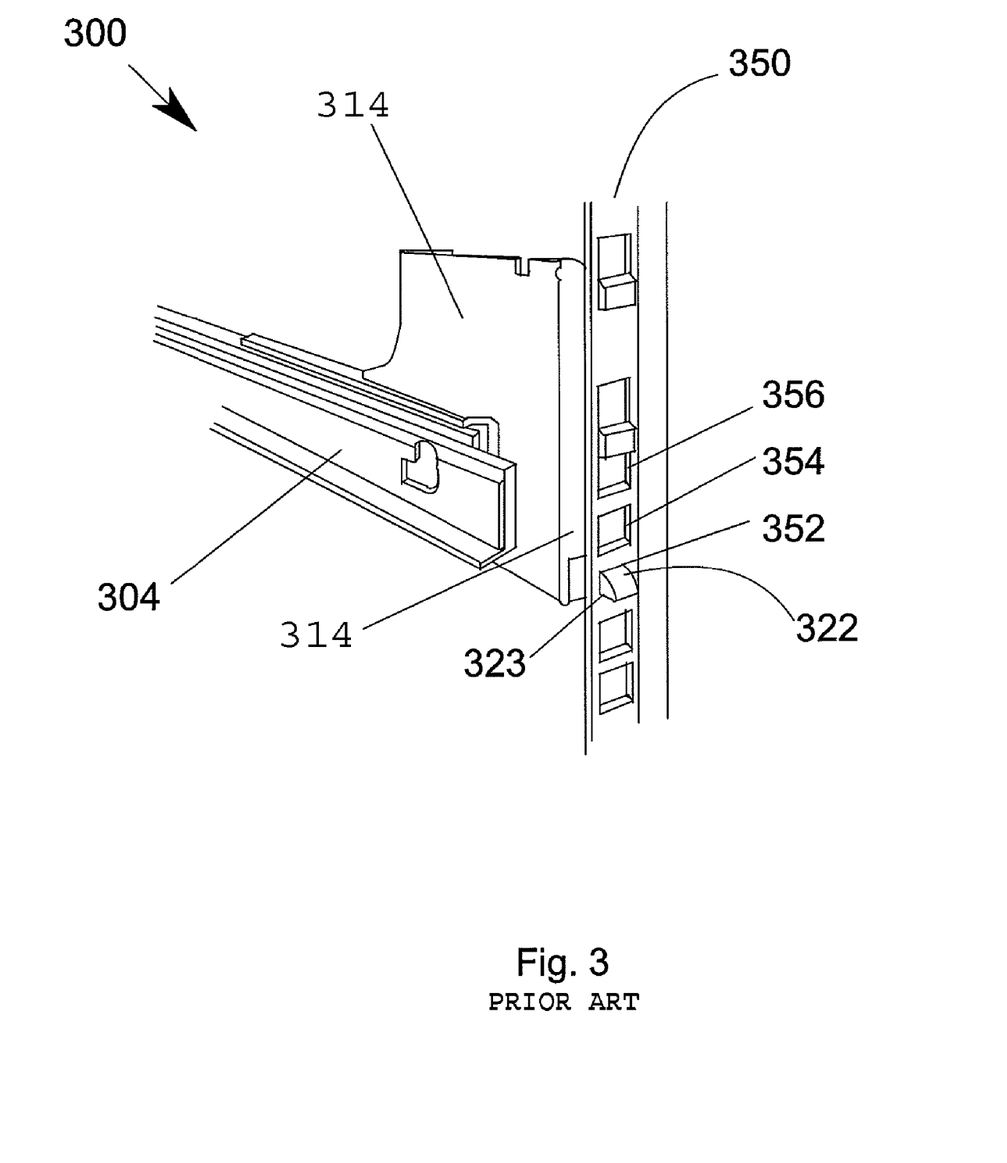
FIG. 3 illustrates a toolless rack mounting rail system that cannot accommodate round holes in the rack system.

FIG. 3 illustrates a toolless rack mounting rail system 300 that cannot accommodate round holes in the rack system. In FIG. 3, a single rail 304 and one rack support member 350 are shown. The rack support member 350 is configured with rectangular or square apertures, e.g., three apertures 352, 354, 356. The rail 304 in FIG. 3 includes a bracket member 314 engaged with a rack rail 350.

Bracket member 314 interacts and engages with rack rail 350 such that locking portion 322 extends through and engages first aperture 352. Locking portion 322 is configured to allow the rail 350 to pivot to disengage locking portion 322 from first aperture 352. Locking portion 322 includes a resilient member, such as a spring assembly, that urges locking portion 322 into an engaged position 323. However, a user may selectively position locking portion 322 into a disengaged position by applying a force to the locking portion 322.

Figure 4:
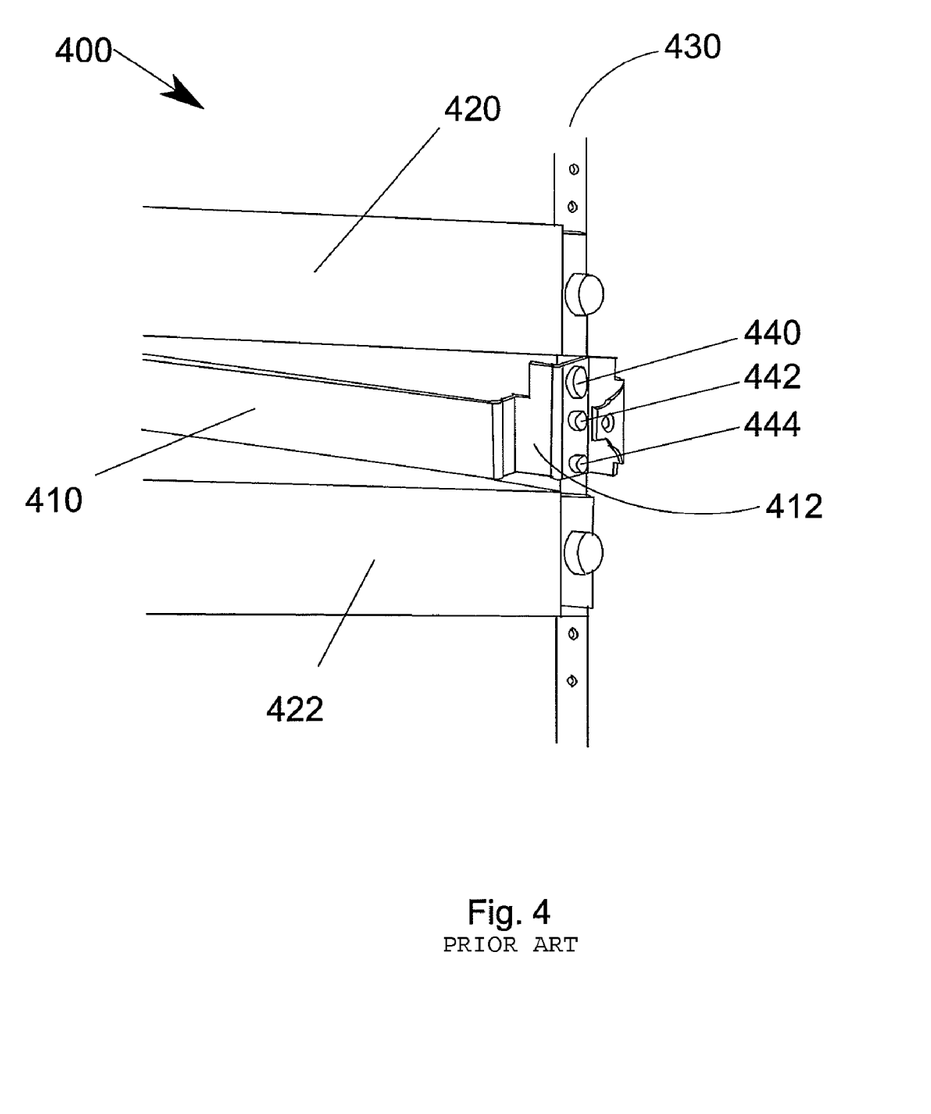
FIG. 4 illustrates one toolless mounting rail system that does not allow for maximum width systems to fit into the rack.

FIG. 4 illustrates one toolless mounting rail system 400 that does not allow for maximum width systems to fit into the rack. In FIG. 4, a rail 410 is shown position between two devices 420, 422 that are mounted to support structure 430 of a rack mounting system. The rail 410 includes a bracket 412 that is attached to the rack support structure 430 using three fasteners 440, 442, 444, e.g., quick release thumb screws. The bracket 412 extends inwardly and wraps around the interior side of the rack support structure 430. System volume is sacrificed because the bracket 412 that holds onto the support structure 430 of the rack must wrap around the support structure 430, thus taking a portion of the volume inside of the rack allotted to the system. On highly dense "1 U" servers, this loss of volume can be meaningful.

Figure 5:
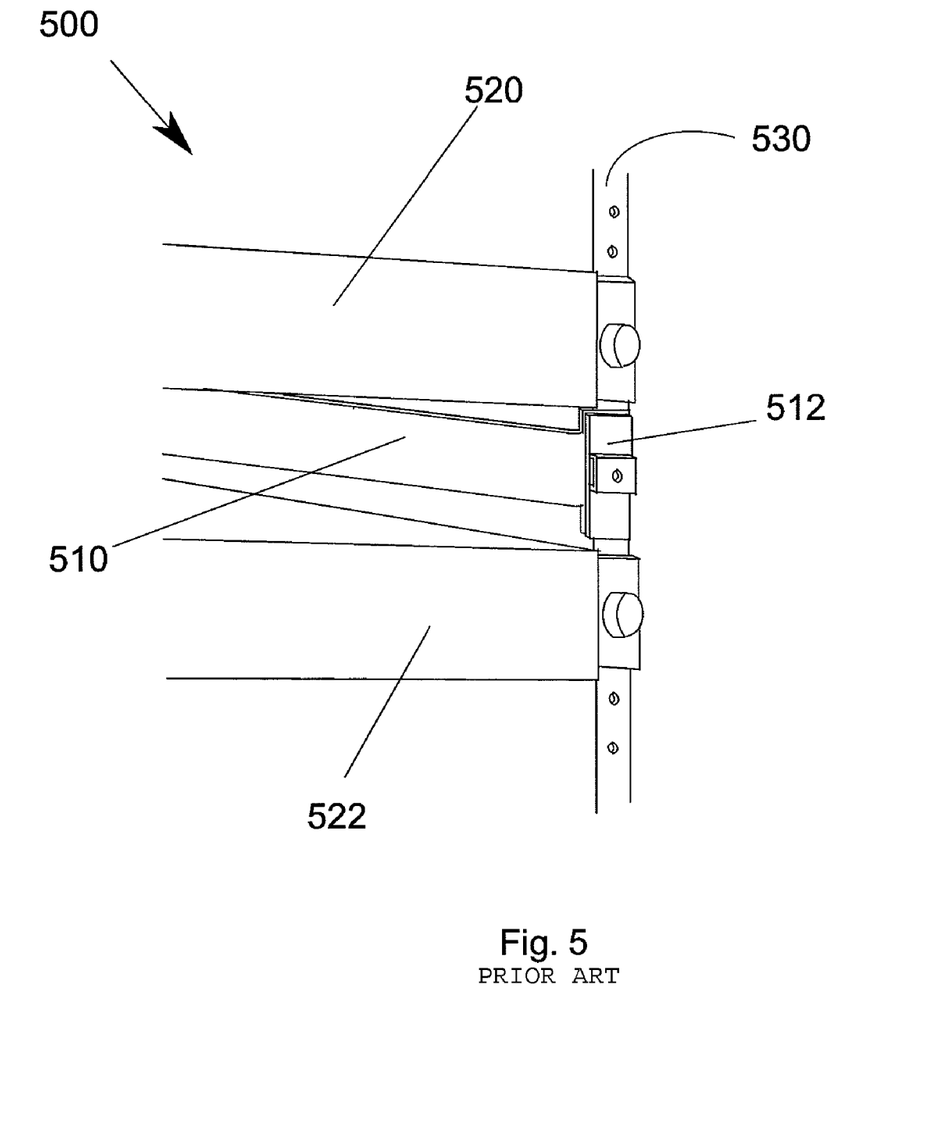
FIG. 5 is another toolless mounting rail system that does not allow for maximum width systems to fit into the rack.

FIG. 5 is another toolless mounting rail system 500 that does not allow for maximum width systems to fit into the rack. In FIG. 5, a rail 510 is again shown positioned between two devices 520, 522 that are mounted to support structure 530 of a rack mounting system. The rail 510 includes a bracket 512 that is attached to the rack support structure 530. Again, the bracket 512 extends inwardly and wraps around the interior side of the rack support structure 530. Thus, this design also sacrifices system volume because the bracket 512 that is attached to the support structure 530 of the rack must wrap around the support structure 530, thus taking a portion of the volume inside of the rack allotted to the system.

Figure 6:
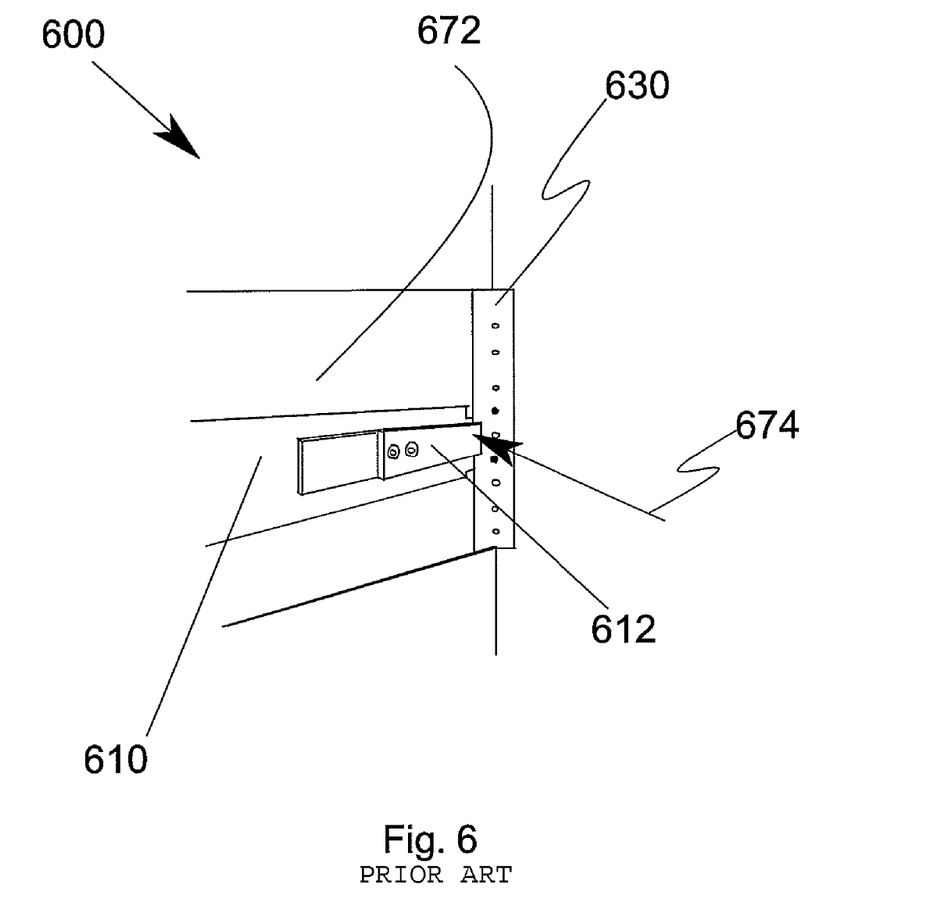
FIG. 6 shows a side of a rack system.

FIG. 6 shows a side of a rack system 600. In FIG. 6, a side door panel is not shown so that the interior 672 of the rack system is visible. A rail 610 is shown mounted to a rack support structure 630. In order to remove the rail 610, a technician must reach into the rack in order to press and release the release latch 612 on the rail 610. This task can be difficult when removing a single system from a fully loaded rack because the release mechanism is located inside the actual mounting point on the rack. In FIG. 6, the force 674 to release the release latch 612 on the rail 610 from the side of the rack is shown. However, the side of a rack may be inaccessible if there are multiple racks lined up side by side, for example, in a datacenter.

Therefore, prior toolless rail mounting fastening methods and systems can not be released without reaching into the rack, cannot accommodate various rack mounting hole shapes and sizes, and can not be utilized with maximum width systems.

Figure 7:
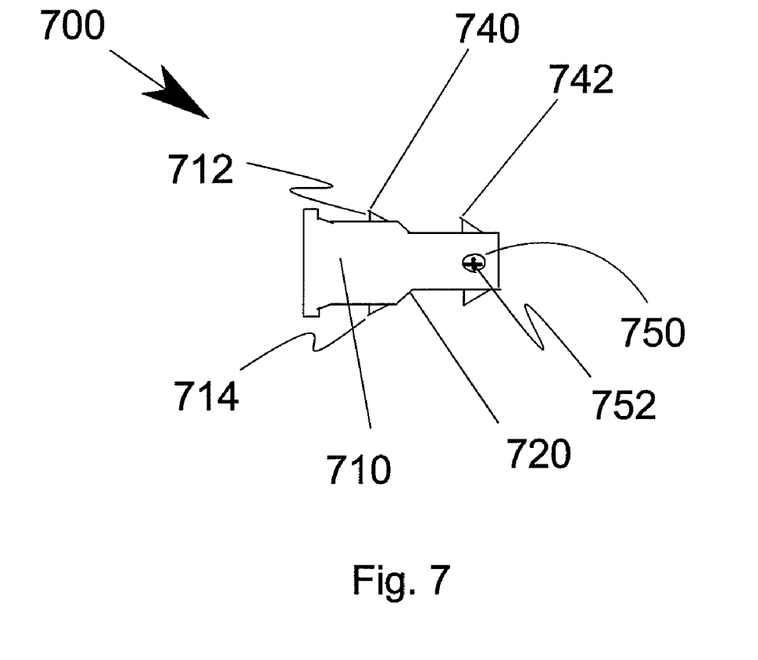
FIG. 7 illustrates an assembled retention device for providing toolless rack mounting rail installation according to an embodiment of the present invention.

FIG. 7 illustrates an assembled retention device 700 for providing toolless rack mounting rail installation according to an embodiment of the present invention. In FIG. 7, a pin 710 is shown with latches 712, 714 extending out the sides of the pin 710. The pin 710 has stepped features 720 for engaging the mounting rails so that a retention device 700 according to an embodiment of the present invention may accommodate multiple rack mounting hole sizes. Inside the pin 710, latches 712, 714 spread and hook onto the outside of the rack mounting apertures once the pin 710 is pushed through the rack-mounting aperture. These latches 712, 714 each have two hooks 740, 742 that can hook into racks with different size holes, e.g., EIA standard square holed rack or round holed rack. The latches 712, 714 prevent the pin 710 from backing out or accidentally being pushed out. The latches 712, 714 both hinge about a common axis. A shaft 752 may be pushed through an axis aperture 750 in the stepped pin 710 to provide a pivot axis for the latches 712, 714. The latches 712, 714 of the pin 710 are pushed outwardly from inside the pin 710 in order for the pin 710 to be fastened into the rack.

Figure 8:
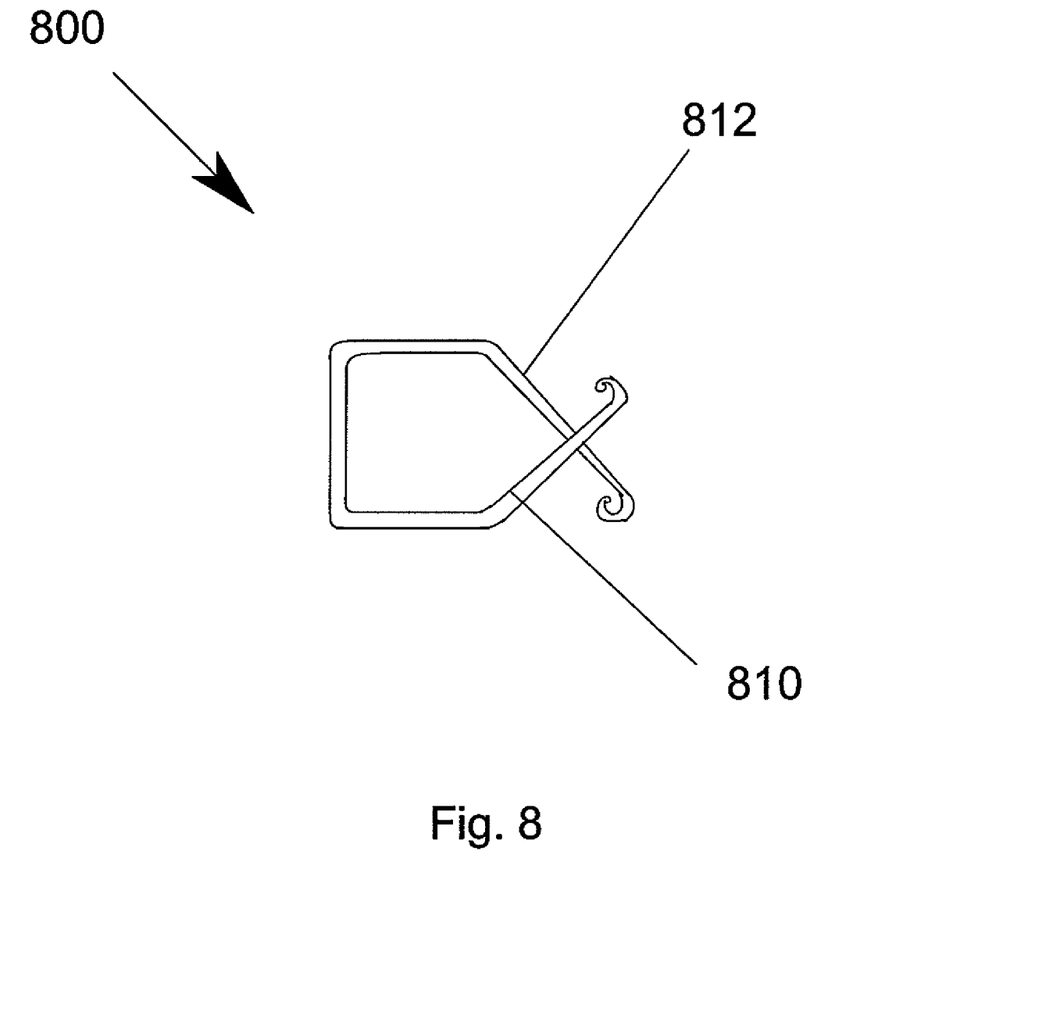
FIG. 8 illustrates a resilient member for providing a force to the latches of a retention device according to an embodiment of the present invention.

FIG. 8 illustrates a resilient member 800, such as a spring assembly, for providing a load to the latches of a retention device according to an embodiment of the present invention. The resilient member 800 is configured to insert in the pin and apply a force to the latches to cause the latches to be spring-loaded. The resilient member 800 includes crossing arms 810, 812 that are hidden within the body of the stepped pin. Accordingly, the latches are always in the latched position when released.

Figure 9:
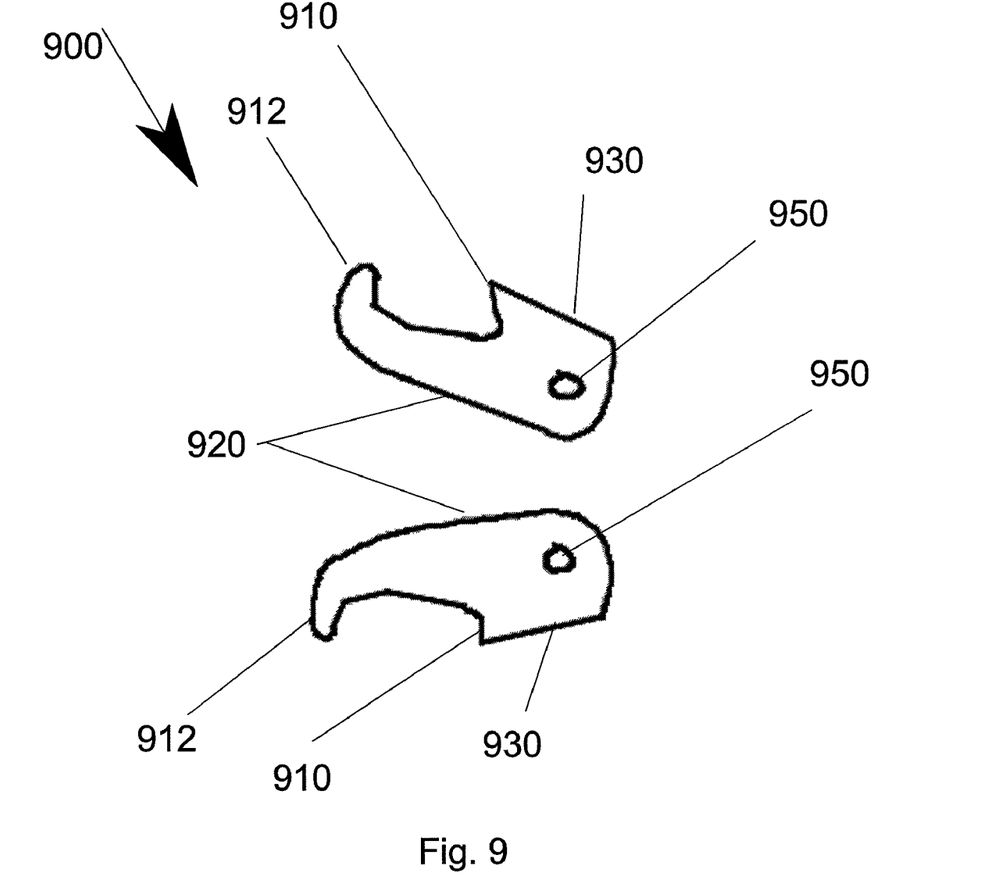
FIG. 9 shows the latches of the retention device according to an embodiment of the present invention.

FIG. 9 shows the latches of the retention device 900 according to an embodiment of the present invention. The latches 900 are symmetric and include double hooks 910, 912. The intermediate hook 910 is designed to engage with the support rail in a round-hole rack and the hook on the end 912 of the latch 900 is designed to engage with the support rail on a square-holed rack. The long flat side 920 on each latch bears on the crossed arms of the resilient member to stay biased towards the outer locked position. Further, the latches 900 have ramped leading edges 930 so that when the pin is pushed through the aperture in the rack, the ramped edges 930 automatically cause the latches 900 to retreat into the pin housing before the latches 900 snaps back out to a retained position once the pin has completely passed through the mounting aperture in the rack. Each of the latch pieces 900 includes an axle aperture 950 that accepts a shaft for forming a joint about which the latch pieces may be rotated outwardly.

Figure 10:
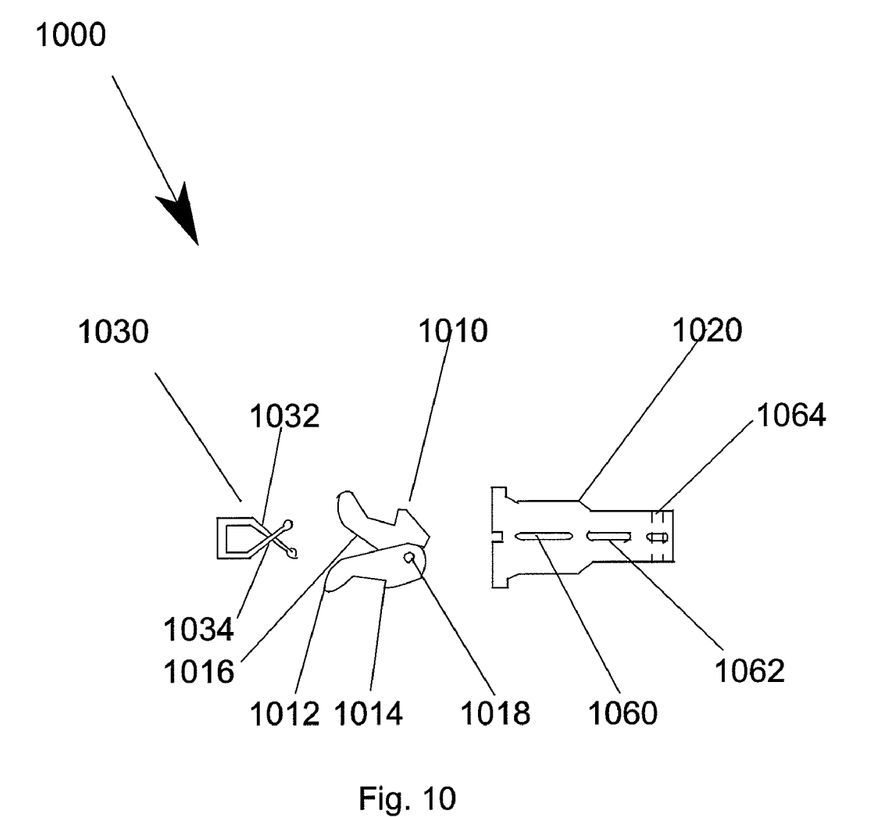
FIG. 10 shows the components of a retention device according to an embodiment of the present invention.

FIG. 10 shows the components of a retention device 1000 according to an embodiment of the present invention. The latches 1010 are inserted into the pin 1020. The double hooks 1012, 1014 of the latches 1010 align with apertures 1060, 1062 on the pin 1020. The resilient member 1030 is inserted into the pin 1020 and engages the latches 1010 to cause the latches 1010 to be spring-loaded. The long flat side 1016 on each latch 1010 bears on the crossed arms 1032, 1034 of the resilient member 1030 to stay biased towards the outer locked position. Each of the latch pieces 1010 includes an aperture 1018 that accepts an axis pin that is routed through an aperture 1064 in the pin 1020 once the latches 1010 are inserted into the pin 1020. The latches 1010 thus rotated about an axis formed by the axis pin.

Figure 11:
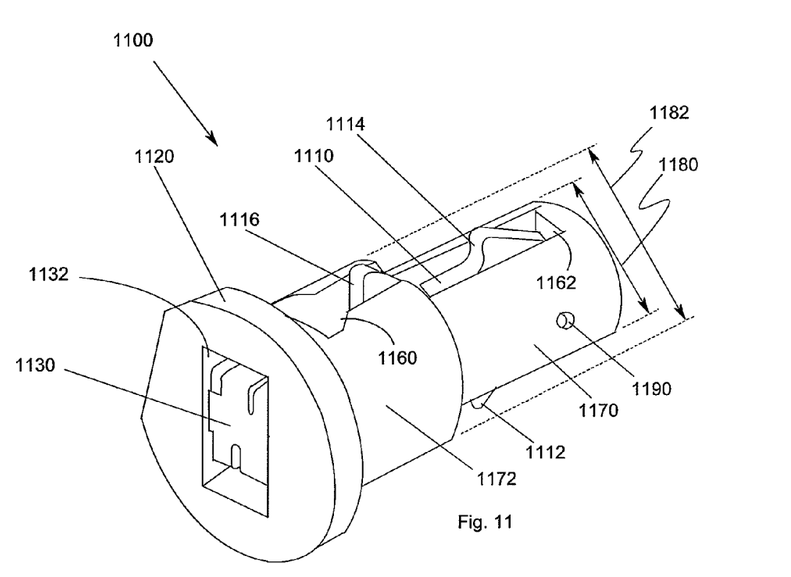
FIG. 11 is an isometric view of a retention device according to an embodiment of the present invention.

FIG. 11 is an isometric view of a retention device 1100 according to an embodiment of the present invention. In FIG. 11, the latches 1110, 1112 are shown partially recessed in the openings 1160, 1162 of the pin 1120. The two latches 1114, 1116 are shown in the two apertures 1160, 1162, wherein a first aperture 1162 is disposed in a first area 1170 of the pin 1120 having a first thickness 1180 for engaging apertures in the rack having a first range of widths, and a second apertures 1160 is disposed in a second area 1172 of the pin having a second thickness 1182 for engaging apertures in the rack having a second range of widths. The resilient member 1130 is inserted into the pin 1120 at the insertion aperture 1132 at the back of the pin 1120. The resilient member 1130 engages the latches 1110, 1112 to cause the latches 1110, 1112 to be spring-loaded and biased towards the outer locked position so that the latches 1114, 1116 extend out of the apertures 1160, 1162 in the pin 1120. However, the latches 1110, 1112 may be easily depressed for insertion of the pin 1120 into the rack or for removal of the pin 1120 from the rack. An axis pin (not shown) is inserted through axis aperture 1190 in the pin 1120 once the latches 1110, 1112 are inserted into the pin housing 1120. The latches 1110, 1112 thus rotate about an axis formed by the axis pin (not shown) in aperture 1190.

Figure 12A:
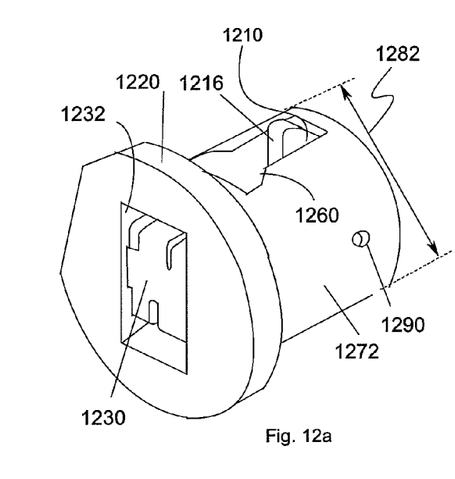
FIGS. 12a-b shows retention devices according to additional embodiments of the present invention.
Figure 12B:
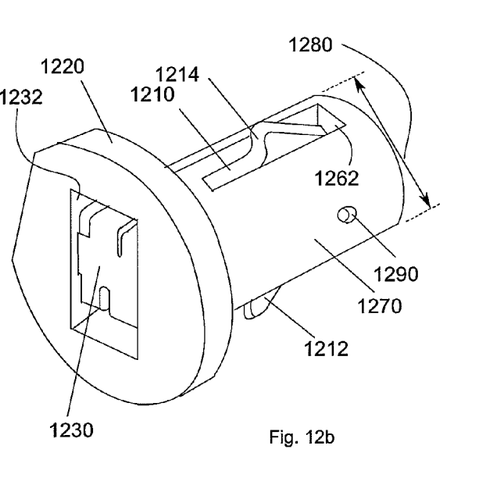

FIGS. 12*a*-*b* shows retention devices according to additional embodiments of the present invention. While the retention devices in FIGS. 12*a*-*b* do not provide the ability to accommodate the range of various rack mounting hole shapes and sizes as the retention device 1100 in FIG. 11, the retention devices in FIGS. 12*a*-*b* do include the other advantages described in the embodiments of the invention.

In FIG. 12*a*, the retention device is configured only with the first stepped portion 1272 (stepped portion 1172 in FIG. 11). Thus, the retention device shown in FIG. 12*a* is configured for use with rack support members having a range of widths and sizes that is correspond to the dimensions of the first stepped portion 1272. In FIG. 12*a* only latch 1210 having lock 1216 is visible in aperture 1260. The resilient member 1230 is inserted into the pin 1220 at the insertion aperture 1232 at the back of the pin 1220. The resilient member 1230 engages the latches to cause the latches 1210 to be spring-loaded and biased towards the outer locked position so that the lock 1216 extends out of the aperture 1260 in the pin 1220. However, the latches 1210 may be easily depressed for insertion of the pin 1220 into the rack or for removal of the pin 1220 from the rack. An axis pin (not shown) is inserted through axis aperture 1290 in the pin 1220 once the latches 1210 are inserted into the pin housing 1220. The latches 1210 thus rotate about an axis formed by the axis pin (not shown) in axis aperture 1290.

In FIG. 12*b*, the retention device is configured only with the second stepped portion 1270 (stepped portion 1170 in FIG. 11). Thus, the retention device shown in FIG. 12*b* is configured for use with rack support members having a range of widths and sizes that is correspond to the dimensions of the second stepped portion 1270. Again, the resilient member 1230 is inserted into the pin 1220 at the insertion aperture 1232 at the back of the pin 1220. The resilient member 1230 engages the latches 1210, 1212 to cause the latches 1210, 1212 to be spring-loaded and biased towards the outer locked position so that the lock 1214 extend out of the apertures 1262 in the pin 1220. However, the latches 1210, 1212 may be easily depressed for insertion of the pin 1220 into the rack or for removal of the pin 1220 from the rack. A shaft (not shown) is inserted through axis aperture 1290 in the pin housing 1220 once the latches 1210, 1212 are inserted into the pin housing 1220. The latches 1210, 1212 thus rotate about an axis formed by the axis pin (not shown) in axis aperture 1290.

Figure 13:
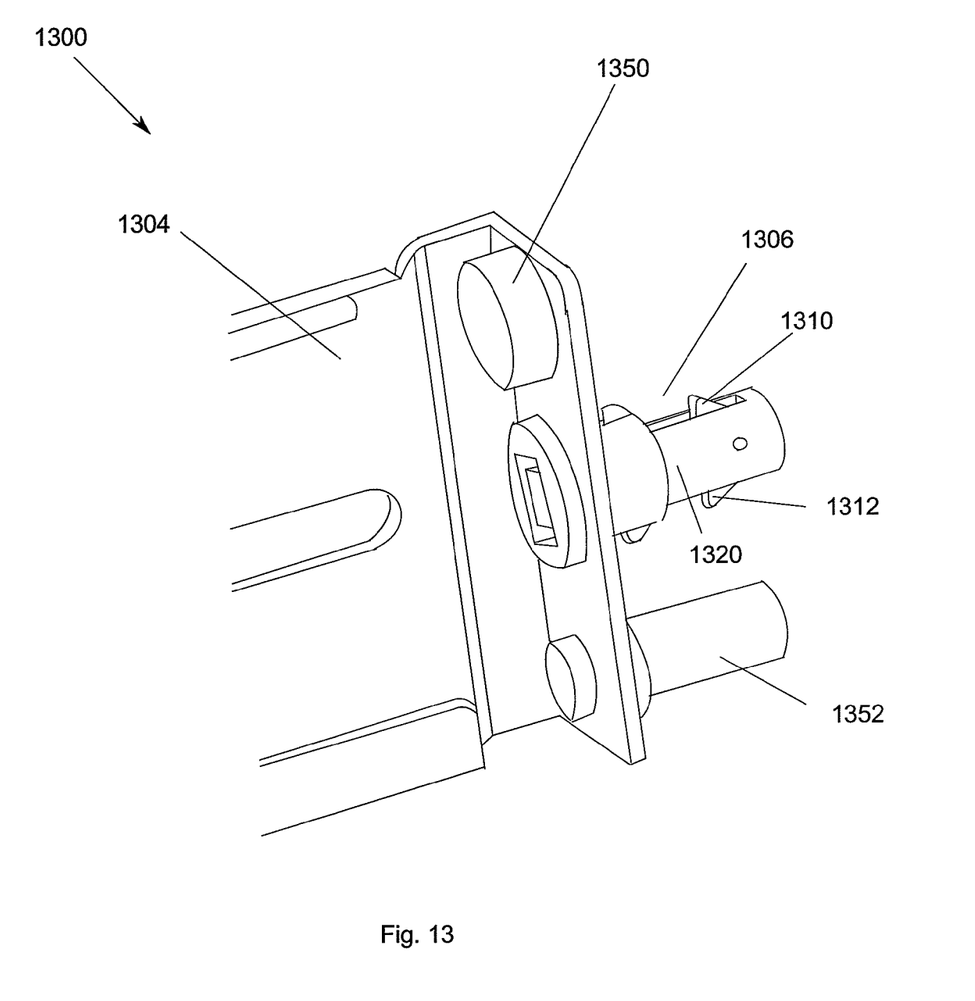
FIG. 13 shows an end of a rack-mounting rail according to an embodiment of the present invention.

FIG. 13 shows an end of a rack-mounting rail system 1300 according to an embodiment of the present invention. In FIG. 13, the end of the rack-mounting rail 1304 includes a retention device 1306, i.e., pin assembly, according to an embodiment of the present invention with the latches 1310, 1312 shown protruding from the pin 1320 at top and bottom. A press-nut 1350 is shown at the top of the rail 1304 for accepting a screw through an aperture in the rack support structure. A long stepped pin 1352 is shown at the bottom of the rail 1304 for aligning the rail 1304 with the rack.

Figure 14:
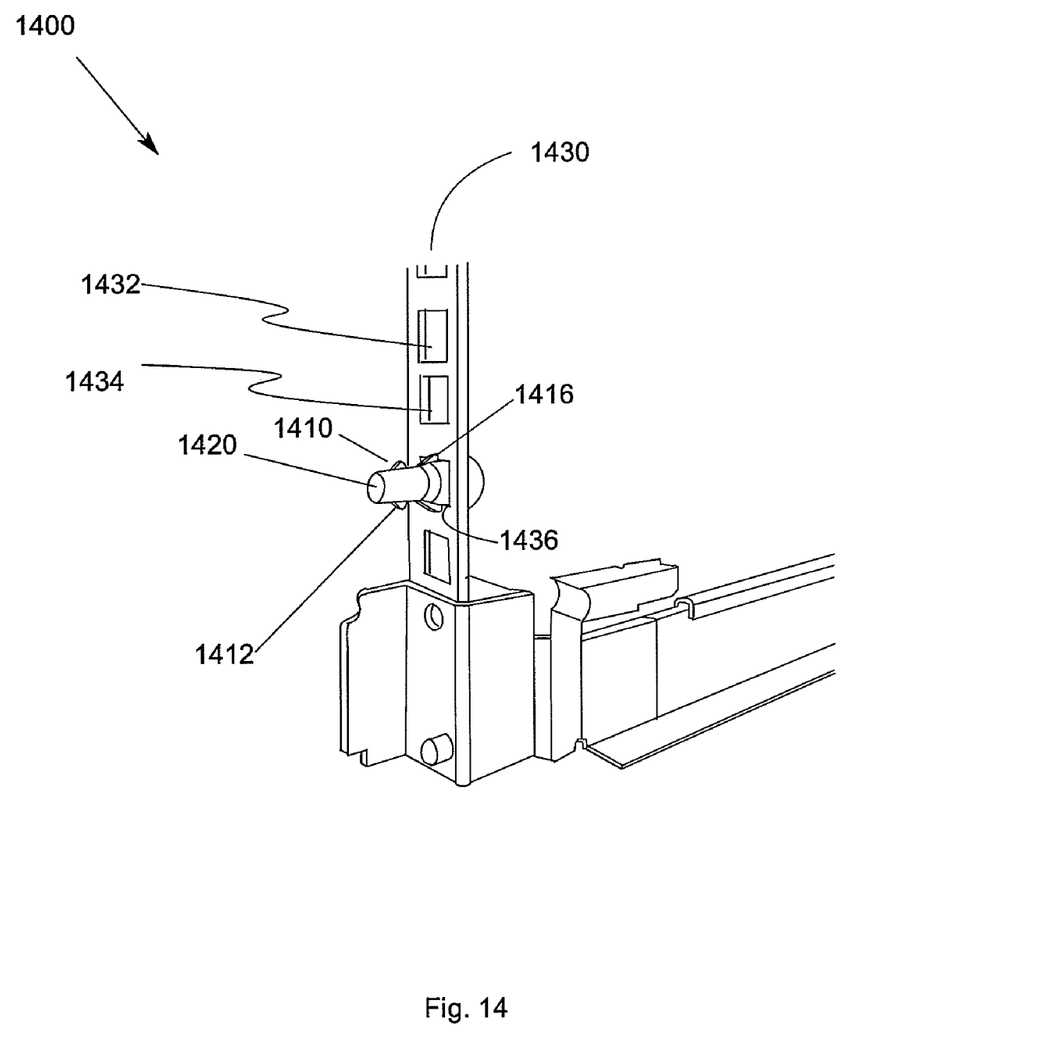
FIG. 14 shows a retention device protruding through a square-holed rack according to an embodiment of the present invention.

FIG. 14 shows a retention device 1400 protruding through a square-holed rack according to an embodiment of the present invention. In FIG. 14, the latch is removed from the rail for clarity. The support structure 1430 includes a plurality of square apertures 1432, 1434, 1436. The pin 1420 having stepped features is inserted through a square aperture 1436 past the second lock 1416 of the latches 1410, 1412 to the second level 1472 of the pin 1420. While square aperture 1432, 1434, 1436 are shown in FIG. 14, those skilled in the art will recognize that the stepped features and dual lock configurations will allow the retention device 1400 to be used with all standard rack support structures including those having round apertures. The retention device 1400 may be released from the rack by simply depressing the latches 1410, 1412 in the pin 1420 and pushing the pin 1420 inwardly. Accordingly, the retention device 1400 may be inserted or removed without the use of tools and accommodates various rack mounting aperture shapes and sizes. Moreover, because a technician does not have to reach into the rack from the sides to insert or release the retention device 1400, which can be difficult when removing a single system from a fully loaded rack, system volume is not sacrificed. The retention device 1400 eliminates the need for a bracket that wraps around the support structure, thereby allowing the full volume inside the rack to be used to facilitate the use of maximum width systems.

Figure 15:
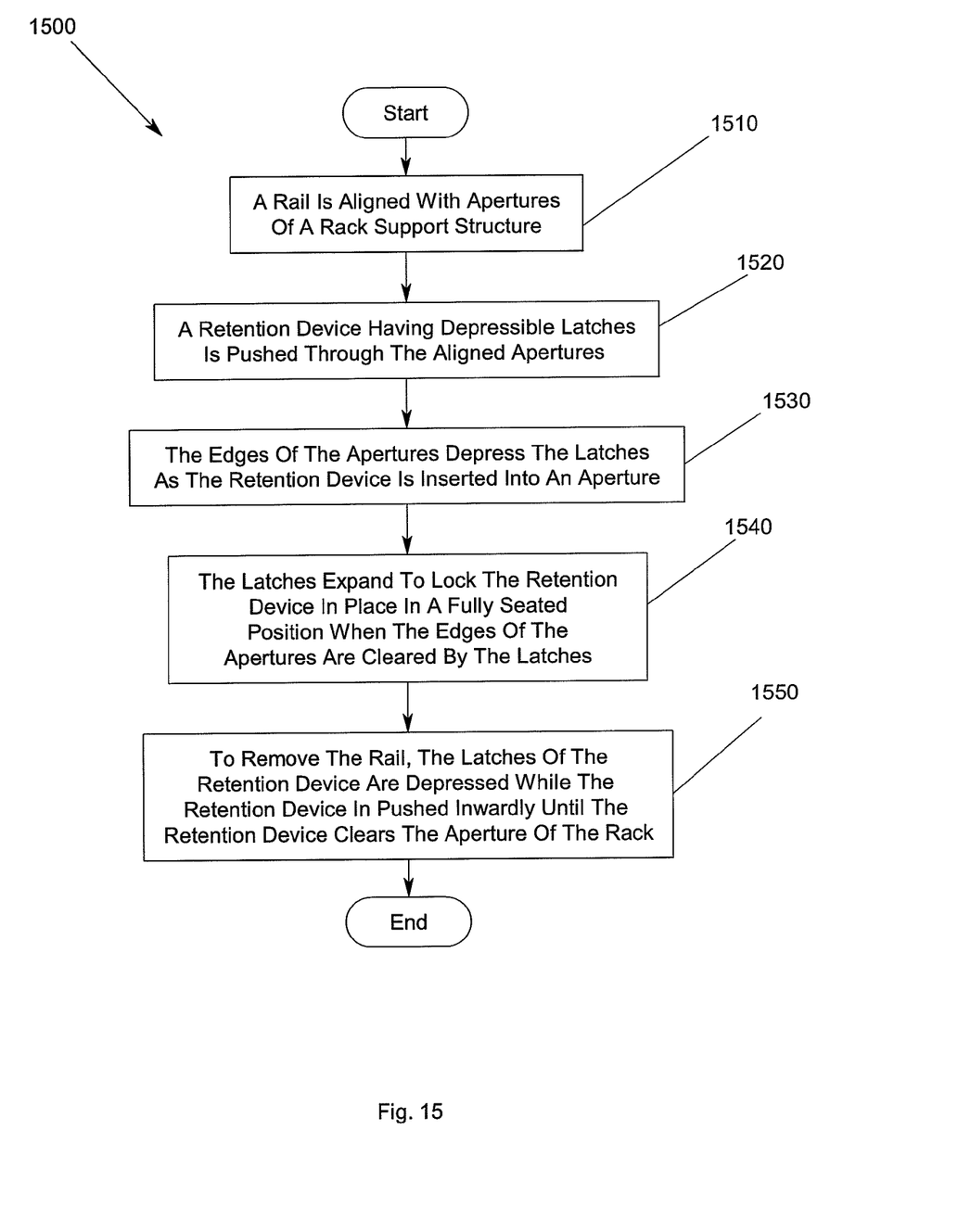
FIG. 15 is a flow chart of a method for providing toolless rack mounting rail installation according to an embodiment of the present invention.

FIG. 15 is a flow chart of a method for providing toolless rack mounting rail installation according to an embodiment of the present invention. In FIG. 15, a rail is aligned with apertures of a rack support structure 1510. A retention device having depressible latches is pushed through the aligned apertures 1520. The edges of the apertures depress the latches as the retention device is inserted into an aperture 1530. The latches expand to lock the retention device in place in a fully seated position when the edges of the apertures are cleared by the latches 1540. To remove the rail, the latches of the retention device are depressed while the retention device in pushed inwardly until the retention device clears the aperture of the rack 1550.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A retention device for mounting a rail which defines an aperture having an edge, to a rack mount support member which defines an aperture having an edge, in a rack mount system, comprising:
   a pin housing configured to be inserted into aligned apertures of the rail and the rack mount support member, and to engage edges of the aligned apertures of the rail and the rack mount support member, said pin housing having a first and second aperture disposed on a first side of the pin housing along a longitudinal axis;
   a first and second latch disposed within the pin housing, the first and second latches each having a first and second lock; and
   a resilient member arranged in the pin housing to apply a force to the latches to urge first and second locks through the first and second aperture of the pin housing, respectively.

2. The retention device of claim 1, wherein the pin housing further comprises a third and fourth aperture disposed on a second, opposite side of the pin housing along a longitudinal axis.

3. The retention device of claim 1, wherein the pin housing further includes a proximal end and a distal end, the pin housing having an insertion aperture at the proximal end and extending a predetermined distance within the pin housing.

4. The retention device of claim 1, wherein the pin housing includes a stepped feature, the stepped feature configured for providing a first pin housing portion having a first width and a second pin housing portion having a second width.

5. The retention device of claim 4, wherein the first width of the first pin housing portion is configured to correspond to a round aperture in a rack mount support member.

6. The retention device of claim 4, wherein the first width of the first pin housing portion is configured to correspond to a square aperture in a rack mount support member.

7. The retention device of claim 1, wherein the resilient member comprises a spring having arms that cross to provide opposing forces to the first and second latches.

8. The retention device of claim 1, wherein the first and second latches are symmetrical, the first and second latch each having the first and second lock disposed along a side and a flat side for engaging the resilient member.

9. The retention device of claim 1, wherein the first and second lock of the first and second latch have a ramped edge for engaging an edge of an aperture in a rack mount support member when inserted therein.

10. The retention device of claim 1, wherein the pin housing includes an axis aperture and wherein the first and second latch have an axle aperture, the retention device further comprising a shaft retained in the axis aperture of the pin housing and the axle aperture of the first and second latch to enable the first and second latch to pivot about an axis formed by the shaft.

11. The retention device of claim 1, wherein the first and second latch are depressible.

12. The retention device of claim 1, wherein the pin housing includes a pin head structure and a shaft, the pin head structure configured to be wider than an aperture in a rack mount rail.

13. The retention device of claim 1, wherein the pin housing includes a stepped feature, the stepped feature configured for providing a first pin housing portion having a first width and a second pin housing portion having a second width, wherein the first aperture of the pin housing is disposed in the first pin housing portion on a first side of the pin housing and the second aperture of the pin housing is disposed in the second pin housing portion on the first side of the pin housing.

14. The retention device of claim 13 further comprising a third aperture disposed in the first pin housing portion on a second side, opposite from the first side and a fourth aperture disposed in the second pin housing portion on the second side.

15. The retention device of claim 14, wherein the first and second locks of the first latch are aligned with the first and second apertures of the pin housing and the first and second locks of the second latch are aligned with the third and fourth apertures of the pin housing.

16. A retention device for mounting a rail which defines an aperture having an edge, to a rack mount support member which defines an aperture having an edge, in a rack mount system, comprising:
   a pin housing configured to be inserted into aligned apertures of the rail and the rack mount support member, and to engage edges of the aligned apertures of the rail and the rack mount support member, said pin housing having a first aperture disposed on a first side of the pin housing along a longitudinal axis;
   a first and second latch disposed within the pin housing, the first and second latches each having a lock; and
   a resilient member arranged in the pin housing to apply a force to the latches to urge the locks of the first and second latches through the first aperture of the pin housing, respectively.

17. The retention device of claim 16, wherein the pin housing has a shaft portion, the first aperture being disposed in the shaft portion and the shaft portion having a predetermined thickness configured to correspond to a round aperture in a rack mount support member.

18. The retention device of claim 16, wherein the pin housing has a shaft portion, the first aperture being disposed in the shaft portion and the shaft portion having a predetermined thickness configured to correspond to a square aperture in a rack mount support member.

19. A method for providing toolless rack mounting rail installation, comprising:
   aligning apertures of a rail with apertures of a rack support structure wherein the apertures of the rail and rack support structure have edges;
   pushing a retention device having depressible latches in a first position through aligned apertures of the rail and the rack support member;
   depressing the latches to a second position as the retention device is inserted into an aperture; and
   expanding the latches to the first position to lock the retention device in place after the retention device is placed in a fully seated position and the edges of the apertures are cleared by the latches.

20. The method of claim 19 further comprising removing the rail from the rack support structure by depressing the latches of the retention device while the retention device in pushed inwardly until the retention device clears the aperture of the rack.

* * * * *